(12) United States Patent
Zhang et al.

(10) Patent No.: US 10,455,737 B2
(45) Date of Patent: Oct. 22, 2019

(54) OPTICAL MODULE

(71) Applicant: InnoLight Technology (Suzhou) LTD., Suzhou, Jiangsu (CN)

(72) Inventors: Chao Zhang, Jiangsu (CN); Kewu Wang, Jiangsu (CN)

(73) Assignee: InnoLight Technology (Suzhou) Ltd., Suzhou (CN)

( * ) Notice: Subject to any disclaimer, the term of this patent is extended or adjusted under 35 U.S.C. 154(b) by 0 days.

(21) Appl. No.: 16/177,846

(22) Filed: Nov. 1, 2018

(65) Prior Publication Data

US 2019/0174654 A1 Jun. 6, 2019

(30) Foreign Application Priority Data

Nov. 20, 2017 (CN) .................. 2017 2 1550600 U

(51) Int. Cl.
| | | |
|---|---|---|
| *H05K 7/20* | (2006.01) | |
| *G06F 1/16* | (2006.01) | |
| *G06F 1/18* | (2006.01) | |
| *G06F 1/20* | (2006.01) | |
| *H01L 23/34* | (2006.01) | |
| *H01L 23/427* | (2006.01) | |
| *H01L 23/467* | (2006.01) | |
| *H01L 23/473* | (2006.01) | |
| *H04B 10/40* | (2013.01) | |

(52) U.S. Cl.
CPC ..... *H05K 7/20409* (2013.01); *H05K 7/20145* (2013.01); *H04B 10/40* (2013.01)

(58) Field of Classification Search
CPC .... H05K 7/20; G06F 1/16; G06F 1/18; G06F 1/20; H01L 23/34; H01L 23/427; H01L 23/467; H01L 23/473

USPC ..... 361/249.01, 679.02, 689, 692, 695, 702, 361/772; 257/E23.088, E23.098

See application file for complete search history.

(56) References Cited

U.S. PATENT DOCUMENTS

| | | | | |
|---|---|---|---|---|
| 5,592,363 A | * | 1/1997 | Atarashi | ............... H01L 23/467 165/185 |
| 6,347,747 B1 | * | 2/2002 | Nesbitt | ............... G01K 13/022 236/78 D |
| 6,678,157 B1 | * | 1/2004 | Bestwick | .................. G06F 1/20 165/104.34 |
| 8,743,540 B1 | * | 6/2014 | Nishihara | .......... H05K 7/20572 165/104.33 |
| 2002/0036890 A1 | * | 3/2002 | Furuya | .................. H01L 23/427 361/702 |

(Continued)

*Primary Examiner* — Xiaoliang Chen
(74) *Attorney, Agent, or Firm* — Finnegan, Henderson, Farabow, Garrett & Dunner, LLP

(57) ABSTRACT

An optical module includes a housing, a PCB base board, an optical assembly, and a heat generating device. The PCB base board, the optical assembly, and the heat generating device are arranged in the housing. The heat generating device is thermally connected to the housing. A plurality of ribs are arranged outside the housing. Air flow channels are formed between the plurality of ribs and extend along a longitudinal direction of the optical module. Each one of the ribs has a first end portion, a second end portion, and a middle portion that connects the first end portion and the second end portion. A radial width of at least one of the ribs gradually increases from the first end portion of the at least one of the ribs toward the middle portion of the at least one of the ribs.

10 Claims, 2 Drawing Sheets

(56) References Cited

U.S. PATENT DOCUMENTS

| | | | |
|---|---|---|---|
| 2003/0076652 A1* | 4/2003 | Ahn | G06F 1/1616 361/679.02 |
| 2008/0037227 A1* | 2/2008 | Fujiwara | G06F 1/203 361/722 |
| 2008/0093973 A1* | 4/2008 | Jung | H01J 63/02 313/495 |
| 2013/0088871 A1* | 4/2013 | Yun | F21V 5/007 362/249.01 |
| 2014/0036440 A1* | 2/2014 | Inoue | H01L 23/467 361/692 |
| 2016/0270205 A1* | 9/2016 | Kamimura | H05K 1/0203 |

* cited by examiner

OPTICAL MODULE

CROSS-REFERENCE TO RELATED APPLICATION

This application is based upon and claims priority to Chinese Patent Application 201721550600.0, filed on Nov. 20, 2017, the entire content of which is incorporated herein by reference.

FIELD OF THE DISCLOSURE

This disclosure relates to the field of electrical communication device technology, particularly to an optical module.

BACKGROUND

As bandwidth continues to increase in the field of optical communication, the bandwidth of optical modules is upgrading as well. In response to market demand for high-bandwidth and high-speed data transmission, module design has increasingly turned toward miniaturization and high density. The higher speed of optical modules is generally associated with higher power, and the higher power of optical modules is associated with higher bulk heat density, which leads to a higher operating temperature for the optical module. Thus, the performance of temperature-sensitive elements and devices that convert light into electricity or electricity into light, as well as the performance of temperature-sensitive chips in the optical module will be greatly reduced, even resulting in the entire module's inability to operate normally, or a loss of effectiveness. Therefore, a more efficient heat dissipation structure is needed to improve heat dissipation.

SUMMARY

A purpose of the present disclosure model is to address the issue of an optical module's inefficient heat dissipation.

To achieve the aforementioned purpose, embodiments of the present disclosure provide an optical module including a housing, a PCB base board, an optical assembly, and a heat generating device. The PCB base board, an optical assembly, and a heat generating device are arranged in the housing. The heat generating device is thermally connected to the housing. A plurality of ribs are arranged outside the housing. Air flow channels are formed between the plurality of ribs and extend along a longitudinal direction of the optical module. Each one of the ribs has a first end portion, a second end portion, and a middle portion that connects the first end portion and the second end portion. A radial width of at least one of the ribs gradually increases from the first end portion of the at least one of the ribs toward the middle portion of the at least one of the ribs.

In comparison with currently available technology, the heat dissipation structure of the optical module provided by the embodiments of the present disclosure reduces air resistance and increases air flow speed so that a fan of a given power may produce greater air flow volume and higher air flow speed, thus increasing the optical module's heat dissipation efficiency.

DETAILED DESCRIPTION

The text below provides detailed descriptions of specific embodiments illustrated in the attached drawings. However, these embodiments do not limit this disclosure; the scope of protection for this disclosure covers changes made to the structure, method, or function by persons having ordinary skill in the art on the basis of these embodiments.

Figure 1:
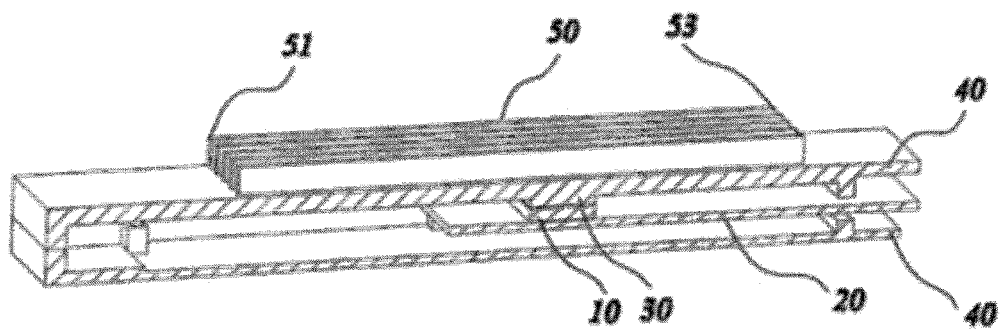
FIG. 1 is a cross-sectional structural diagram illustrating an optical module, according to an exemplary embodiment of the present disclosure.

FIG. 1 is a cross-sectional structural diagram illustrating an optical module, according to an exemplary embodiment of the present disclosure. Referring to FIG. 1, an optical module including a housing 40, a PCB (Printed Circuit Board) base board 20, an optical assembly (which may be a prism, a wavelength division multiplexer, an optical fiber, a reflective mirror, etc.; not illustrated here), and a heat generating device 10. The PCB 20, the optical assembly, and the heat generating device 10 are arranged in the housing 40. Here, the heat generating device 10 is thermally connected to the housing 40. The heat generating device 10 may be installed on the PCB base board 20 or directly secured onto the housing 40. In this exemplary embodiment, the heat generating device 10 is secured onto the PCB base board 20. The heat generating device 10 is, for example, an electronic chip, an optical receiver, or a laser, etc. The housing 40, which is made of a material that has good thermal conductivity such as copper, aluminum, an alloy, etc., encloses the heat generating device 10, the optical assembly, and the PCB base board 20. Here, a portion of the heat generated by the heat generating device 10 is conducted by the PCB base board 20, and another portion of the heat generated by the heat generating device 10 is conducted by the housing 40. As an example for the purpose of illustration, one heat generating device 10 is used. In other exemplary embodiments, the quantity and location of the heat generating device 10 may be set according to actual need. Further, the heat generating device 10 is thermally connected to the housing 40 by a cooling pad 30 so that good thermal contact between the heat generating device 10 and the housing 40 is achieved.

Figure 2:
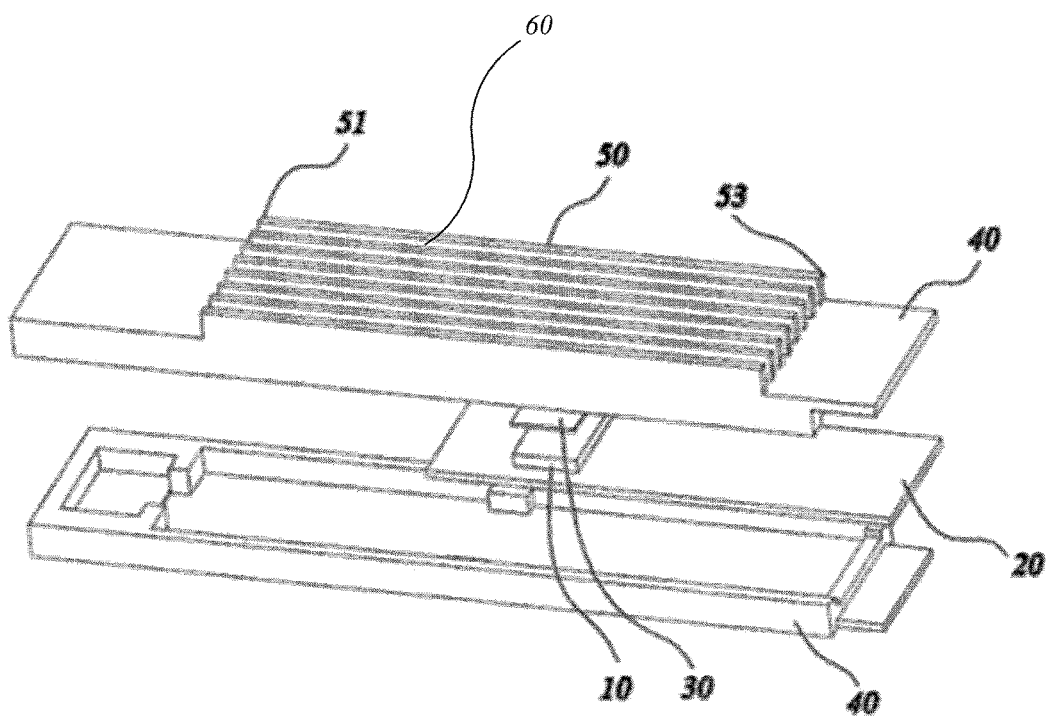
FIG. 2 is an exploded view of the optical module of FIG. 1.

FIG. 2 is an exploded view of the optical module of FIG. 1. Referring to FIG. 1 and FIG. 2, a plurality of ribs 50 are arranged on an outer surface of an upper part of the housing 40, and the ribs 50 and the upper part of the housing 40 are formed as one piece. The ribs 50 are configured in an approximately parallel pattern. "Approximately" as used herein means that the ribs 50 are not structured as straight lines but extend along the same direction. Neighboring ribs 50 are configured with space in between, and the space between the neighboring ribs 50 defines air flow channels 60. The air flow channels 60 extend along a longitudinal direction of the optical module. The longitudinal direction is from one end of the housing 40 to an opposite end of the housing 40. The heat generated by the heat generating device 10 is at least partially conducted by the housing 40 to the ribs 50. An air flow formed by a fan passes through the air flow channels 60 between the ribs 50 while heat is exchanged between the air in the air flow and the ribs 50 and the air carries away the heat.

The air flow channel 60 has an air inflow end and an air outflow end, located at two opposing ends of the housing 40, respectively. In some embodiments, some ribs 50 may extend along the longitudinal direction of the optical module, and may start from one end of the housing 40 and end at the opposite end of the housing 40.

In an alternative embodiment, at least some ribs 50 may extend non-continuously from the air inflow end to the air outflow end (not illustrated). That is, the ribs 50 are arranged in sections extending along the same direction.

In some embodiments, the ribs 50 and the housing 60 may form a one-piece structure.

Figure 3:
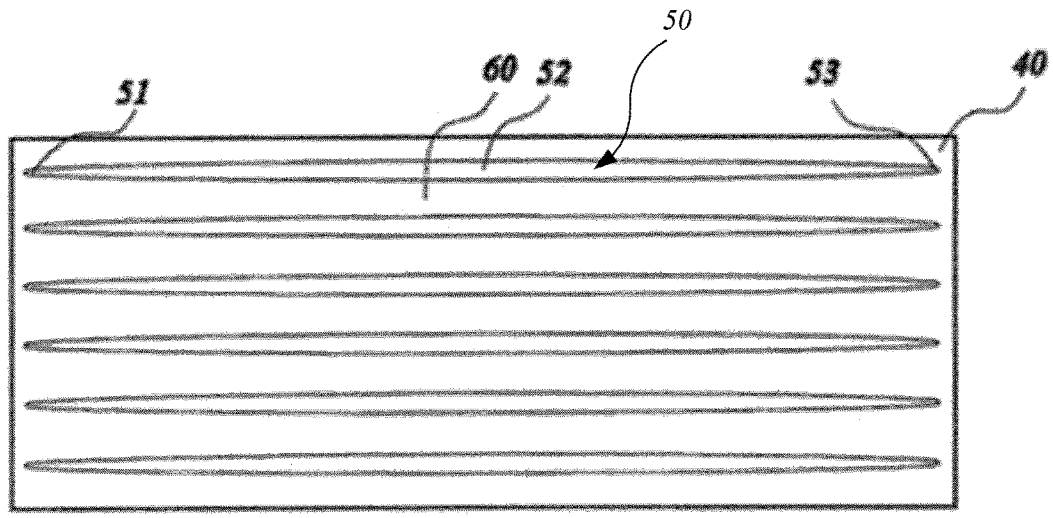
FIG. 3 is a top view diagram illustrating ribs of an optical module, according to an exemplary embodiment of the present disclosure.

FIG. 3 is a top view diagram illustrating the ribs 50 of the optical module, according to an exemplary embodiment of the present disclosure. Referring to FIG. 3, a first end portion 51 of each rib 50 is located at the air inflow end, and a second end portion 53 of the rib 50 is located at the air outflow end. The first end portion 51 has a curved smooth surface. According to aerodynamics, air can flow through the first end portion 51 smoothly without forming a vortex at the air inflow end. Similarly, the second end portion 53 also has a curved smooth surface. Air flows out through the second end portion 53 at a gentle slope, and streams of air flowing out of different air flow channels 60 converge again without forming a vortex at the air outflow end. Such arrangement may reduce air resistance and the loss of air pressure, resulting in an increased volume of air flowing through the air flow channels 60 and increased speed of the air flow. Meanwhile, averting the formation of local vortexes may achieve the purpose of reducing dust accumulation.

The first end portion 51 and the second end portion 53 of each rib 50 are connected by a curved surface so that the air flow channel 60 defined by neighboring ribs 50 takes on a shape that is narrower in the middle and wider at the two ends. The shape of the ribs 50 may be a spindle shape, an oval shape, a raindrop shape, an involute shape, or another shape that is aerodynamically efficient.

Specifically, there are at least two ribs 50, and the gap between the ribs 50 forms the air flow channel 60. Each rib 50 includes the first end portion 51, the second end portion 53, and a middle portion 52 located between these end portions. The radial width of the rib 50 increases gradually from the first end portion 51 toward the middle portion 52 and decreases gradually from the middle portion 52 toward the second end portion 53 so that the cross-sectional area of the air flow channel 60 at both ends thereof is greater than the cross-sectional area of the air flow channel 60 at the middle portion 52. Here, "radial" means perpendicular to the direction in which the ribs 50 extend. According to Bernoulli's equation, air flows faster where the cross-sectional area is smaller in a channel. Therefore, air flows faster in the middle portion of the air flow channel 60, and the air in a faster air flow may reach a longer distance. For the theory, please refer to Heat Transfer: Thermal Management of Electronics by Younes Shabany, Chapter 7/9).

The area where the air flow channel 60 narrows corresponds to a location where heat concentrates on the housing 40, and increased air flow in this area is conducive to heat dissipation.

In one embodiment, the area where the air flow channel 60 narrows corresponds to the location of the heat generating device 10. If there are a plurality of the heat generating devices 10, the width of the air flow channel 60 may also be designed according to the amount and location of heat generated by each of the heat generating devices 10.

The optical module usually includes an optical transceiver interface and an electrical interface. In some embodiments, the location of the area where the air flow channel 60 narrows is arranged near the optical transceiver interface.

Figure 4:
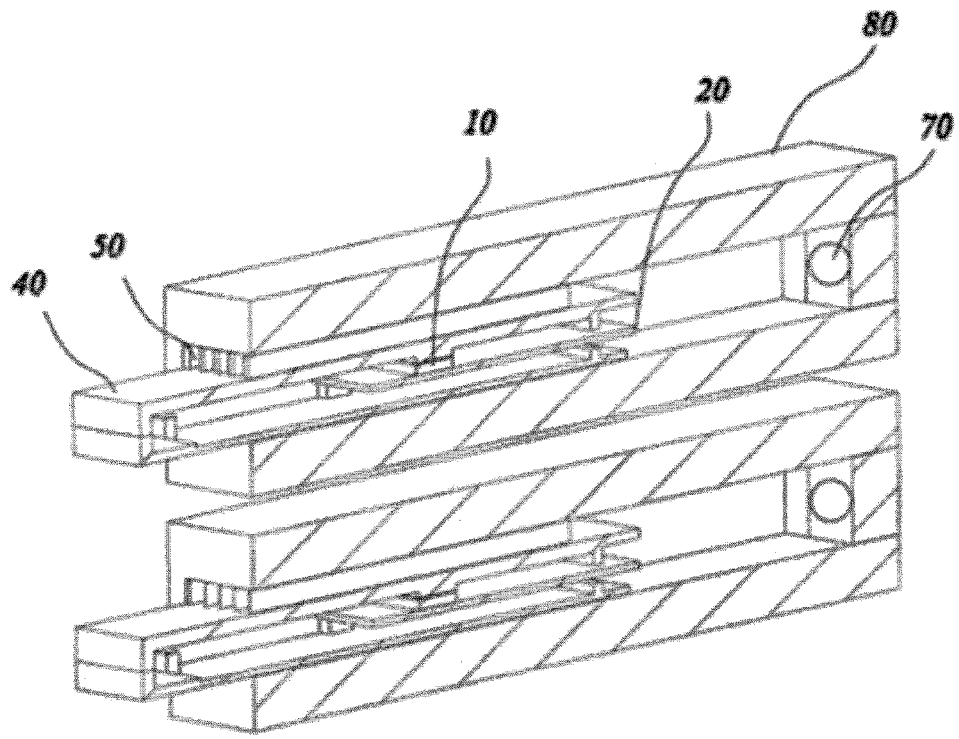
FIG. 4 is a structural diagram illustrating an optical module placed in a cage, according to an exemplary embodiment of the present disclosure.

FIG. 4 is a structural diagram illustrating an optical module placed in a cage, according to an exemplary embodiment of the present disclosure. Referring to FIG. 4, in actual use, the optical module is placed in a cage 80. In this way, a semi-enclosed space is defined, and a fan 70 is arranged at one end of the semi-enclosed space to facilitate air convection in a space where the heat generating device 10 is located to improve heat dissipation efficiency. The fan 70 generates an air flow, and the air flow passes through the ribs of the optical module to carry away the heat generated by the optical module. According to simulation calculation, when a simulation chip is a 5 W chip, in a scenario where all heat dissipation is by means of air flow, the optical module according to the embodiments of the present disclosure may reduce thermal resistance by 0.36 Kelvins/Watt (K/W), and the temperature of the heat generating device may be lowered by 1.8° C. in comparison with a conventional structure. Therefore, the embodiments of the present disclosure achieve good heat dissipation performance by arranging ribs for heat dissipation on the housing of the optical module and designing the shape of the ribs.

It should be understood that despite the descriptions of embodiments in the specification, each embodiment does not entail only one single independent technical solution. The specification is written this way simply for the sake of clarity. Those skilled in the art should treat the specification as a whole. The technical solutions associated with the embodiments may be combined in appropriate ways to form other embodiments that can be understood by persons having ordinary skill in the art.

The series of detailed descriptions above is only intended to provide specific descriptions of feasible embodiments of the present disclosure. The detailed descriptions are not to be construed as limiting the scope of protection for this utility model; all equivalent embodiments or changes that are not detached from the techniques of the present disclosure in essence should fall under the scope of protection of the present disclosure.

What is claimed is:

1. An optical module, comprising:
   a housing; and
   a PCB base board, an optical assembly, and a heat generating device arranged in the housing,
   wherein
   the heat generating device is thermally connected to the housing,
   a plurality of ribs are arranged outside the housing,
   air flow channels are formed between the plurality of ribs and extend along a longitudinal direction of the optical module,
   each one of the ribs has a first end portion, a second end portion, and a middle portion that connects the first end portion and the second end portion, and
   a radial width of at least one of the ribs gradually increases gradually from the first end portion of the at least one of the ribs toward the middle portion of the at least one of the ribs.

2. The optical module of claim 1, wherein the radial width of the at least one of the ribs gradually decreases from the middle portion of the at least one of the ribs toward the second end portion of the at least one of the ribs.

3. The optical module of claim 1, wherein the air flow channels formed between the plurality of ribs are narrowed where heat is concentrated.

4. The optical module of claim 1, wherein the air flow channels formed between the plurality of ribs are narrowed at a location on the housing that corresponds to the heat generating device.

5. The optical module of claim 1, wherein the air flow channels formed between the plurality of ribs are narrowed near a location of an optical transceiver interface of the optical module.

6. The optical module of claim 1, wherein at least one of the first end portion or the second end portion of the at least one of the ribs has a curved smooth surface.

7. The optical module of claim 1, wherein the plurality of ribs extend along the longitudinal direction of the optical module from an end of the housing to an opposite end of the housing.

8. The optical module of claim 1, wherein the heat generating device is a laser, an optical receiver, or an electronic chip.

9. The optical module of claim 1, wherein the shape of the ribs may be at least one of a spindle, an oval, a raindrop shape, or an involute shape.

10. The optical module of claim 1, wherein the ribs and a part of the housing form a one-piece structure.

\* \* \* \* \*